United States Patent [19]

Melanotte et al.

[11] Patent Number: 5,063,424
[45] Date of Patent: Nov. 5, 1991

[54] UPROM MEMORY CELL INTEGRABLE WITH A TABLECLOTH MATRIX EPROM

[75] Inventors: Massimo Melanotte, Milan; Orio Bellezza, Curno, both of Italy

[73] Assignee: SGS-Thomson Microelectronics s.r.l., Agrate Brianza, Italy

[21] Appl. No.: 503,931

[22] Filed: Apr. 4, 1990

[30] Foreign Application Priority Data

Apr. 10, 1989 [IT] Italy .................. 20083 A/89

[51] Int. Cl.⁵ .................. H01L 29/68; H01L 29/78; H01L 27/01; H01L 29/00
[52] U.S. Cl. .................. 357/23.5; 357/23.1; 357/29; 357/55; 357/59
[58] Field of Search .................. 357/23.5, 23.1, 55, 357/29

[56] References Cited

U.S. PATENT DOCUMENTS

| | | | |
|---|---|---|---|
| 4,334,347 | 6/1982 | Goldsmith et al. | 357/23.5 |
| 4,597,060 | 6/1986 | Mitchell et al. | 357/23.5 |
| 4,613,956 | 9/1986 | Paterson et al. | 357/23.5 |
| 4,717,943 | 1/1988 | Wolf et al. | 357/23.5 |
| 4,758,869 | 7/1988 | Eitan et al. | 357/23.5 |
| 4,758,984 | 7/1988 | Yoshida et al. | 357/23.5 |
| 4,812,885 | 3/1989 | Riemenschneider | 357/23.5 |
| 4,905,062 | 2/1990 | Esquivel et al. | 357/23.5 |

Primary Examiner—Jerome Jackson, Jr.
Assistant Examiner—Daniel Kim
Attorney, Agent, or Firm—Sixbey, Friedman, Leedom & Ferguson

[57] ABSTRACT

The UPROM memory cell comprises self-aligned lines of source and lines of drain obtained in a semiconductor substrate. It also comprises a strip of floating gate, a strip of dielectric and a strip of barrier polysilicon, each of these strips being provided with a respective pair of small lateral fins. The UPROM cell lastly comprises a control gate superimposed over and self-aligned with the floating gate.

6 Claims, 5 Drawing Sheets

UPROM MEMORY CELL INTEGRABLE WITH A TABLECLOTH MATRIX EPROM

FIELD OF THE INVENTION

The present invention concerns an UPROM memory cell having a structure compatible with the manufacture of table cloth matrices of EPROM memory cells with self-aligned lines of source and drain, and a process for its manufacture.

DESCRIPTION OF THE RELATED ART

In matrices of EPROM memory cells it is common usage to combine with the actual memory matrix lines and columns of EPROM cells known as <<redundant>>. The object of these cell lines is that of replacing one line of memory cells should a failure have occurred in it. In this way a failure in one memory cell does not imply the failure of the device, as it is then possible to utilize <<spare>> cell lines. Naturally the replacement of a line of matrix cells with one of the redundant lines must be unique and definitive. That is, in the case of the memory being deleted and then rewritten, the new information must again be inserted in the redundant line instead of in the line of memory cells which it replaces.

In order to permanently store the information that a given line of memory cells has been replaced with one of the redundant lines, the so-called UPROM cells are used (unerasable programmable read only memory).

In this cell there is permanently stored the redundant address, that is the address of the redundant line which replaces the defective cell line. The contents of the UPROM cell is not erasable by means of ultraviolet rays which are generally used to erase the EPROM cells, because it is covered by a metallization layer which does not allow the passage of these rays. In addition, the active zone of this cell is located at the end of a tortuous labyrinthine path, wherein the diffusion of rays which may in some way succeed in penetrating into the cell is almost impossible.

Since the EPROM cell and the UPROM cell must be accomplished in a single device, a manufacturing process for such device which allows the simultaneous accomplishment of the two types of cells is desirable.

A particular form of matrices of EPROM memory cells is the so-called table cloth structure with self-aligned lines of source and drain, which is illustrated in the Italian patent application No. 22848 A/88 dated Dec. 5 1988, in the name of the same Applicant.

The matrix according to this structure comprises a conducting substrate on which there are obtained parallel lines of drain and source alternated with one another, floating gate areas placed in a checker-board pattern between these lines of drain and source and self-aligned with them and control gate lines parallel to one another and perpendicular to the lines of source and drain. Areas of field oxide are obtained in the substrate between the parellel lines of drain and source. The floating and control gates are provided with small lateral fins which are superimposed over the field oxide areas.

The presence of fins of the floating and control gates above the field oxide areas allows this type of memory matrix to attain very high values of capacitive ratio.

SUMMARY

The object of the present invention is to accomplish a UPROM cell whose structure is compatible with the manufacturing process of the above table cloth matrix of EPROM cells.

According to the invention such object is attained with a UPROM cell for table cloth matrices of EPROM memory cells with self-aligned lines of source and drain, comprising an active part enclosed in a casing provided with protection against the access of ultraviolet rays, characterized in that said active part comprises lines of source and drain alternated with one another in a semiconductor substrate, between which there are placed strips of floating gate, with superimposed strips of dielectric and of barrier polysilicon, said strips of floating gate, of dielectric and of polysilicon being provided with small lateral fins placed over underlying areas of field oxide self-aligned with said lines of source and drain, and a control gate line superimposed over and self-aligned with said floating gate areas.

BRIEF DESCRIPTION OF THE DRAWINGS

The characteristics and the advantages of the present invention shall be made more evident by the following detailed description of one of its embodiments, illustrated as an example in the enclosed drawings, wherein.

DESCRIPTION OF THE PREFERRED EMBODIMENTS

Figure 1:
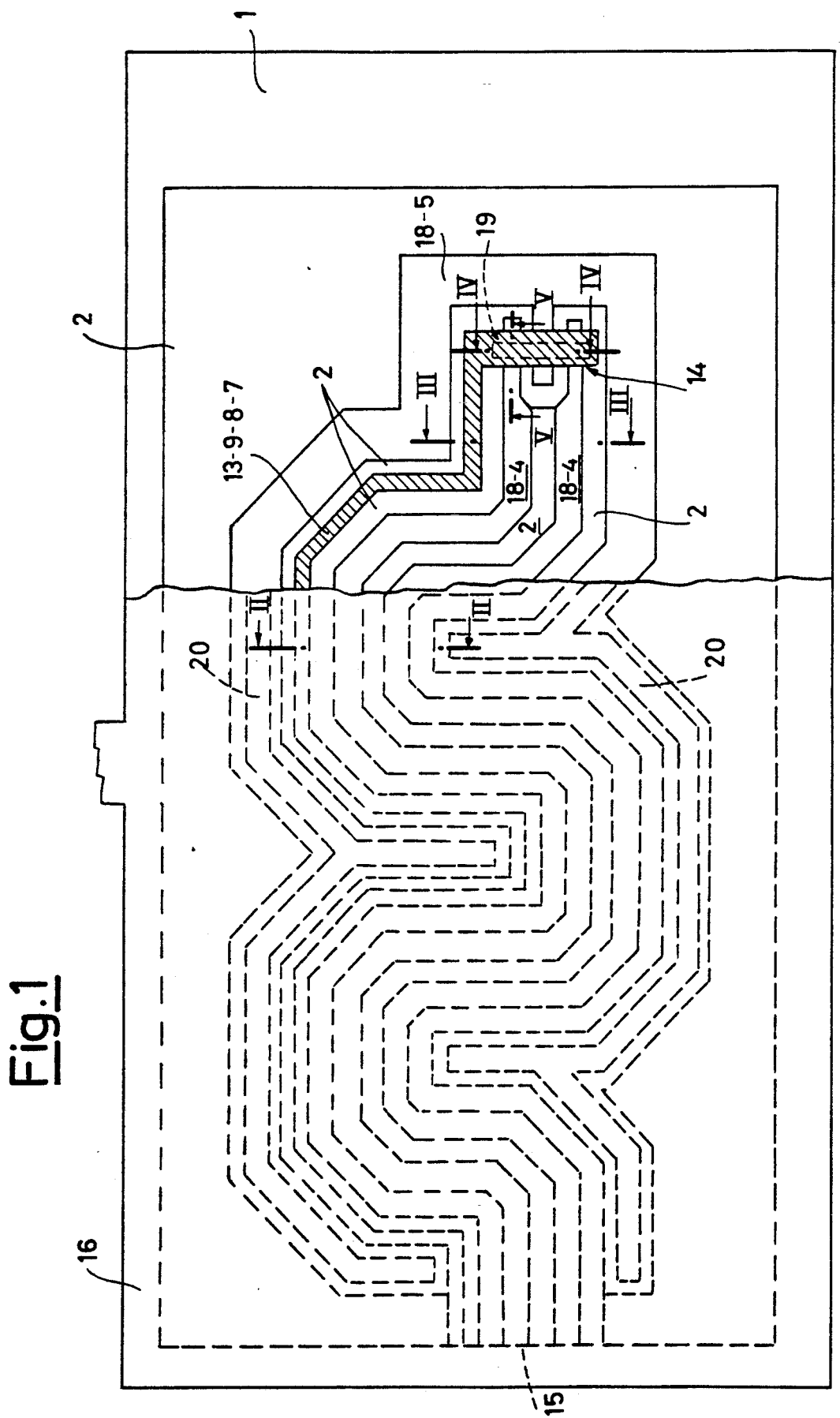
FIG. 1 shows a partially sectioned plan view from above of an UPROM memory cell according to the invention.
Figure 5:
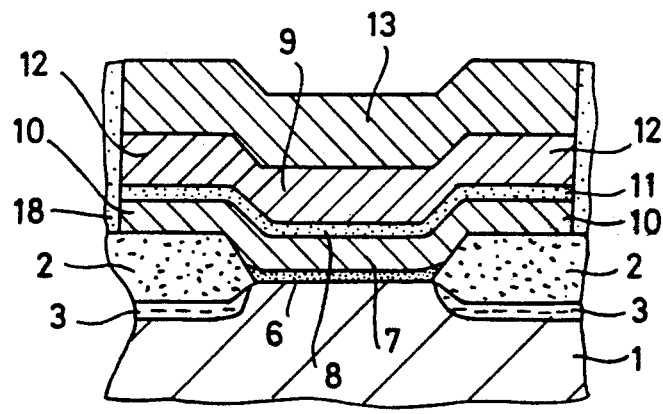
Figure 6:
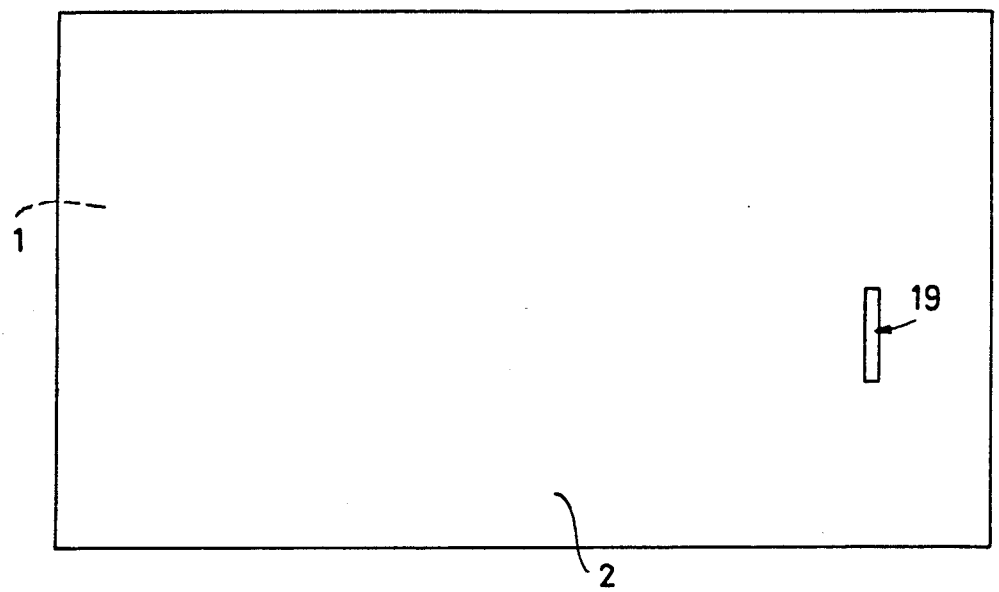
FIGS. 6 and 7 show in a plan view from above the initial stages of the manufacturing process of the UPROM cell.
Figure 11:
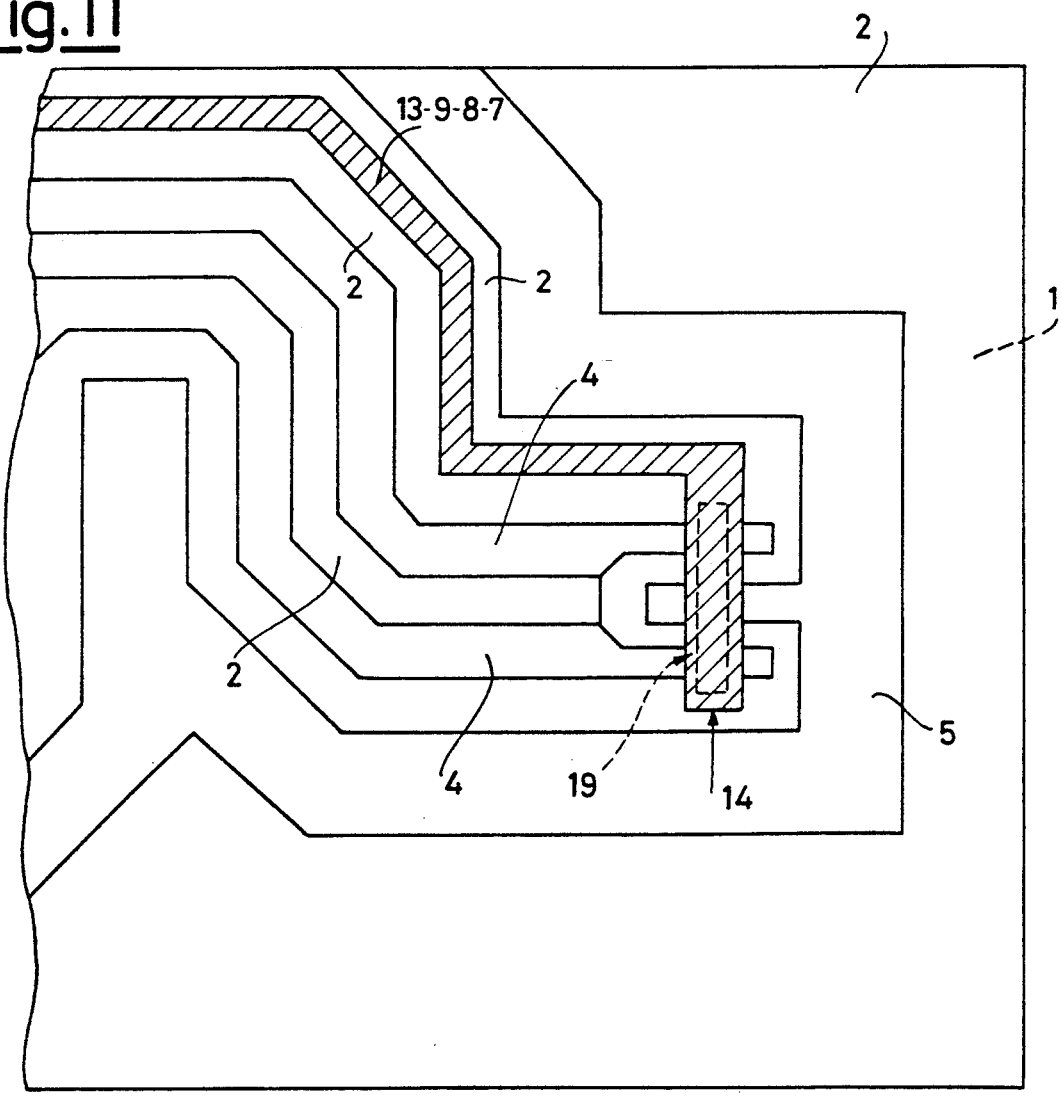
FIG. 11 shows the cell in a plan view from above just before the final metallization.

The UPROM memory cell shown in FIGS. 1 to 5 comprises a semiconductor substrate 1, on which there are made to grow areas of field oxide 2, under which there are implanted insulation zones 3. In substrate 1 there are obtained by means of $N_+$ doping lines of drain 4 and source 5 self-aligned with field oxide areas 2. On a limited active area 19 there is a zone of gate oxide 6 (FIG. 1). Over gate oxide 6 there are present a strip of floating gate 7, a strip of separation dielectric 8 and a strip of polysilicon 9, acting as a barrier to planarization. Each of the strips of floating gate 7, of dielectric 8 and of polysilicon 9 has a pair of small lateral fins, 10, 11, 12, respectively, superimposed over oxide areas 2 in the active part 14 of the cell (FIG. 5). Above polysilicon 9 there is deposited a control gate line 13 self-aligned with the underlying strips 7, 8 and 9. Between each set, formed by floating gate 7, dielectric 8 and polysilicon 9 there are areas of planarization oxide 18.

As can be seen from FIG. 1, the lines of source 5, of drain 4 and of control gate 13 (with the underlying strips 7, 8 and 9) follow a <<labyrinth>> path on substrate 1 and under a cover formed by a passivation layer 17 and by a metallization layer 16 and the active part 14 of the cell is located at one extremity of this path, to avoid ultraviolet rays, which could penetrate, say, through the inlet 15 of the cell, could reach the active part 14, deleting its contents.

The process for the manufacture of the UPROM cell shall now be described with reference to FIGS. 6 to 11.

Figure 3:
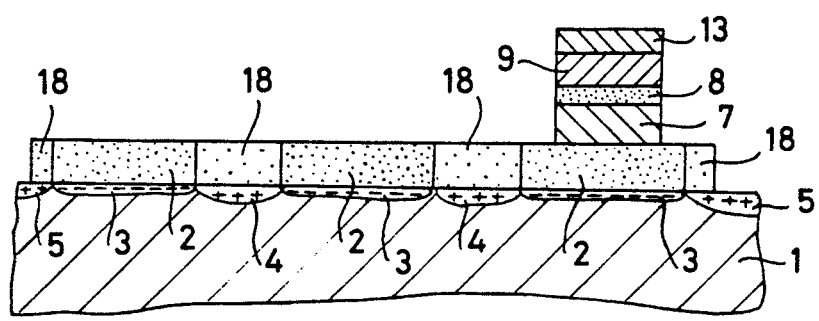
FIGS. 3, 4 and 5 show said UPROM cell, from which the coverage passivation and metallization have been removed, in a cross-sectional view taken along the lines III—III, IV—IV and V—V of FIG. 1.
Figure 4:
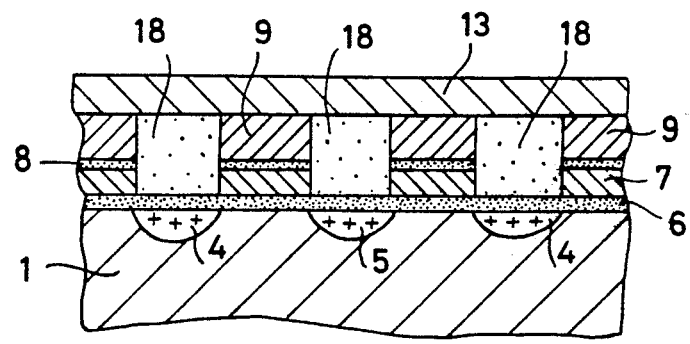

On substrate 1 there is defined, by means of a suitable mask, an active area 19, outside which the insulation implantation 3 (boron) has been defined, on which the field oxide 2 is made to grow (FIG. 3).

The gate oxide 6 is made to grow on area 19, and the channel implantation is accomplished. There is then deposited, everywhere, a first polysilicon level which will finally become the floating gate.

Figure 7:
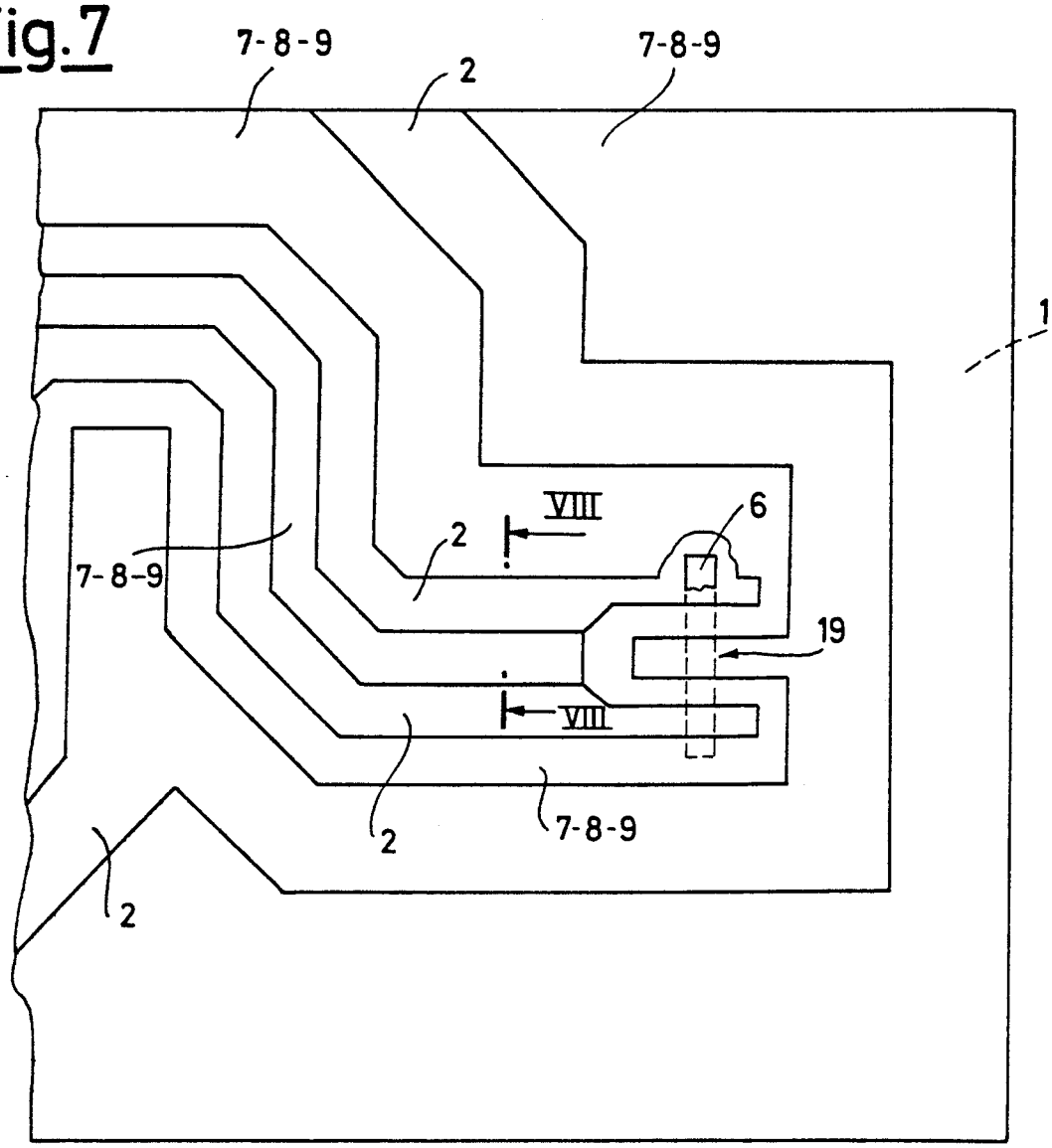
Figure 8:
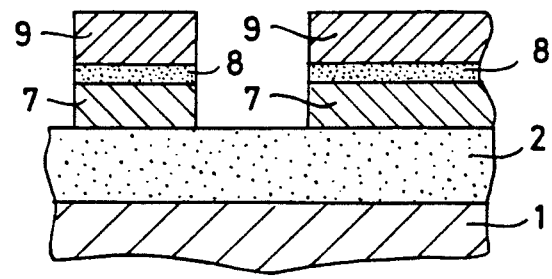
FIG. 8 shows the cell during the manufacturing process, in a cross-sectional view taken along the line VIII—VIII of FIG. 7.

Above the first polysilicon level there are subsequently deposited a dielectric layer 8 and a second polysilicon level 9. Then by means of a first-poly mask the structure is defined by etching the set 9, 8, 7 down to the field oxide 2 (FIGS. 7 and 8).

Figure 9:
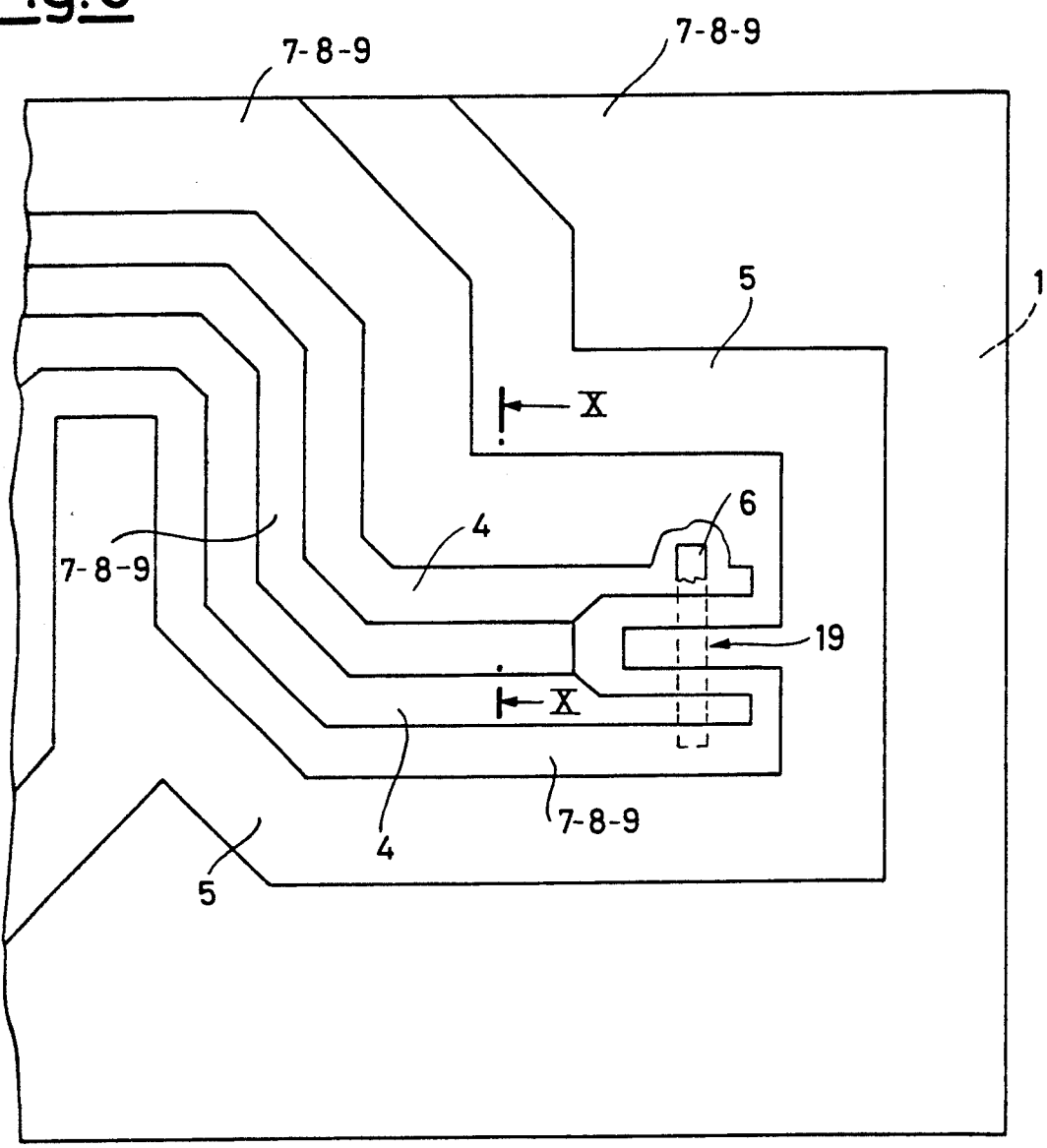
FIG. 9 shows the cell in a plan view from above during a further stage of its manufacturing process.
Figure 10:
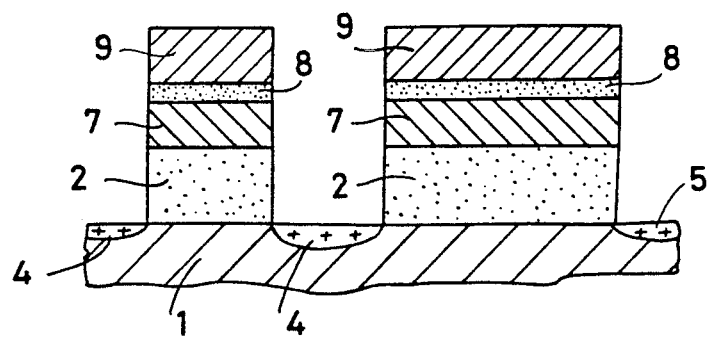
FIG. 10 shows the cell in a cross-sectional view taken along the line X—X of FIG. 9.

The uncovered field oxide 2 is subsequently removed by etching aligned with the first polysilicon level 7, after which the mask is removed. In the substrate 1 there are now implanted the source lines 5 and the drain lines 4, by means of $N_{30}$ doping (FIGS. 9 and 10).

The structure planarization stage occurs next, by means of planarization oxide 18, and a polysilcon or silicide layer 13 is deposited on the planarized structure. There are then defined the control gate 13, the barrier polysilicon 9, the dielectric oxide 8 and the floating gate 7 by means of aligned etching down to the field oxide 2. With this etching there are also defined fins 10, 11 and 12 of the floating gate 7, of the dielectric 8 and of the polysilicon 9, which increase the capacitive coupling of the UPROM cell (FIGS. 11, 3, 4 and 5).

Figure 2:
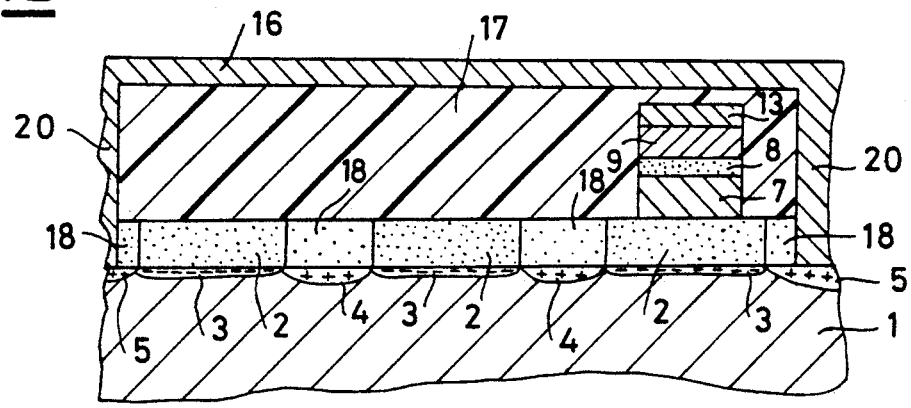
FIG. 2 shows a cross-sectional view taken along the line II—II of FIG. 1.

The layer of intermediate passivation 17 is then deposited, except in the zone above the source line 5, and the metallization 16, thus also accomplishing a source contact 20 (FIGS. 1 and 2).

We claim:

1. An UPROM memory cell for table-cloth matrix of EPROM memory cells, comprising a semiconductor device enclosed in an ultraviolet ray protecting casing provided with a lateral access, said semiconductor device comprising a semiconductor substrate, parallel source and drain lines alternated with each other in a substrate surface, field oxide areas interposed between and self-aligned with said source and drain lines exception being made for an uncovered active area of the substrate surface arranged far from said casing access and extending transversally to said source and drain lines, floating gate areas interposed between said source and drain lines at said active area and provided with lateral extensions placed on said field oxide areas, dielectric and barrier polysilicon areas superimposed on and self-aligned with said floating gate areas and said lateral extensions thereof, and a control gate line superimposed on and self-aligned with said barrier polysilicon areas to electrically connect them to each other, said source and drain lines and said control gate line extending in substantially parallel way from said active area to said casing access along a labyrinth path preventing any entering ultraviolet rays from reaching said active area.

2. An unerasable programmable read-only memory cell designed for integration with EPROM memory cells having a tablecloth matrix structure, comprising:
   a semiconductor substrate;
   parallel source and drain lines alternated with each other in a substrate surface;
   field oxide areas interposed between and aligned with said source and drain lines;
   a semiconductively active area located on said substrate surface;
   ultraviolet ray protecting means for enclosing the cell, said protecting means provided with an access disposed laterally to said active area with respect to said substrate surface, said access connected to said active area by a labyrinth access path arranged such that ultraviolet rays on the outside of said protecting means are prevented from reaching said active area using said access path;
   floating gate areas interposed between said source and drain lines at said active area;
   dielectric and barrier polysilicon areas superimposed on and aligned with said floating gate areas; and
   a control gate line superimposed on and aligned with said barrier polysilicon areas to electrically interconnect said barrier polysilicon areas;
   wherein said source and drain lines and said control gate line extend in a substantially parallel fashion along said labyrinth access path from said active area to said access thereby permitting electrical communication with the cell.

3. The cell of claim 2 wherein said semiconductively active area is disposed transversely with respect to said source and drain lines.

4. The cell of claim 2 wherein said access path changes direction at least twice, thus forming a labyrinth path.

5. The cell of claim 2 wherein said floating gate areas are provided with lateral extensions placed on said field oxide areas and aligned with said dielectric and barrier polysilicon areas.

6. The cell of claim 2 wherein said semiconductively active area is disposed transversely with respect to said source and drain lines, wherein said access path changes direction at least twice, thus forming a labyrinth path, and wherein said floating gate areas are provided with lateral extensions placed on said field oxide areas and aligned with said dielectric and barrier polysilicon areas.

* * * * *